United States Patent [19]

Hales

[11] Patent Number: 4,953,981
[45] Date of Patent: Sep. 4, 1990

[54] LATERAL-SHEARING ELECTRO-OPTIC FIELD SENSOR

[75] Inventor: Walter L. Hales, Huntsville, Ala.

[73] Assignee: The United States of America as represented by the Secretary of the Army, Washington, D.C.

[21] Appl. No.: 389,136

[22] Filed: Aug. 3, 1989

[51] Int. Cl.⁵ ............................................... G01B 9/02
[52] U.S. Cl. ..................................... 356/353; 356/354
[58] Field of Search ....................... 356/353, 354, 345; 350/384, 388

[56] References Cited

U.S. PATENT DOCUMENTS 2,679,183  5/1954  Buchele et al. .................... 356/353
4,595,876  6/1986  Kuhara et al. ..................... 350/388

Primary Examiner—Vincent P. McGraw
Assistant Examiner—S. A. Turner
Attorney, Agent, or Firm—Freddie M. Bush; James T. Deaton

[57] ABSTRACT

A lateral-shearing electro-optic field sensor in which a lateral-shearing interferometer is used in conjunction with an electro-optic crystal and a coherent light source to measure the waveform of an electro-magnetic pulse or a microwave pulse in free space. Depending on the size of the electro-optic crystal used, the device is adapted to measure frequencies as high as 20 GHz.

3 Claims, 1 Drawing Sheet

LATERAL-SHEARING ELECTRO-OPTIC FIELD SENSOR

DEDICATORY CLAUSE

The invention described herein may be manufactured, used, and licensed by or for the Government for governmental purposes without the payment to me of any royalties thereon.

BACKGROUND OF THE INVENTION

Phase-sensing electro-optic field sensors that are already in use are of two basic types, polarimetric and interferometric. The polarimetric types include those based on the Pockels, Kerr, and Faraday effects. The interferometric typic are usually based on Mach Zehnder, Michelson, and Fabry Perot interferometers, ring resonators, and mode couplers. The two-beam interferometric types, i.e., the Mahc Zehnder and Michelson interferometers, may use equal or unequal optical paths in the two branches of the interferometer. Usually, one branch of the interferometer will contain an electro-optic crystal whose index of refraction is dependent on the eletric field in which it is placed.

As all of these types of interferometers are commonly constructed, several optical elements, such as beam splitters and mirrors are used to separate and recombine the beams. These elements are extremely sensitive to alignment, vibration, and thermal distortion. In order to avoid these effects, the branches of the interferometers may be made as channels in a dielectric plate of low coefficient of expansion, such as quartz or low-expansion ceramic glass. This is a very delicate, and usually an extremely expensive procedure.

SUMMARY OF THE INVENTION

This invention consists of a lateral-shearing interferometer which compares the phase of a laser beam passing through an electro-optic crystal with that of a beam passing just outside the crystal. This arrangement avoids the use of beamsplitters and mirrors that are common to other two-beam interferometers. Hence, the interferometer is much less sensitive to misalignment, vibration and temperature differentials, and is much simpler and less costly to build. It still provides the usual two-beam interferometric sensitivity, and can be used to measure electric field strengths produced by electromagnetic pulses (EMP) and microwave devices. If the electro-optic crystal is no more than about 0.25 cm thick, it can respond to frequencies up to 20 GHz.

DESCRIPTION OF THE PREFERRED EMBODIMENT

Figure 1:
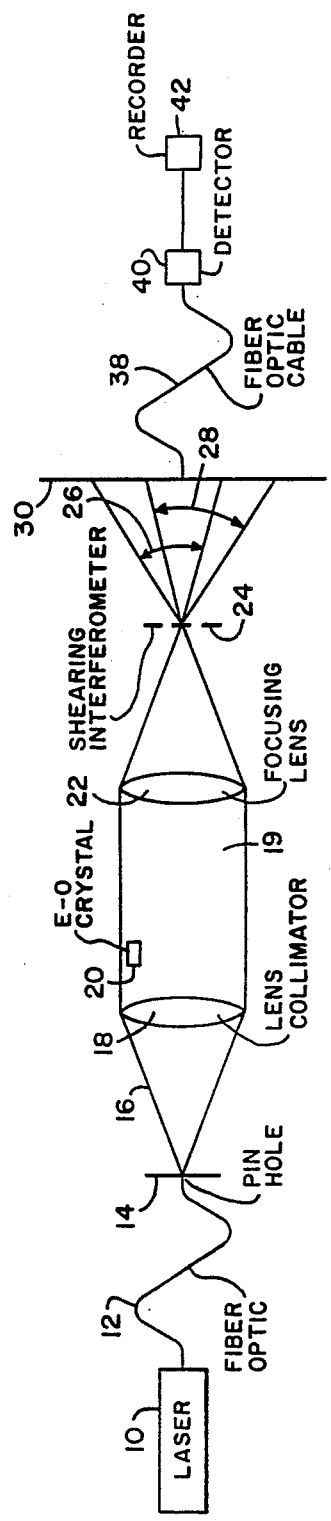
FIG. 1 is a schematic illustration of the optical system of this invention.

Referring now to the drawings, a continuous-wave (CW) laser 10, such as a helium-neon or argon ion laser, emits a beam through an optical fiber 12 to a spacial filter 14. Diffraction through filter 14 diverges the light into a spacially coherent beam 16 which fills the aperture of a collimating lens 18. A collimated beam 19 emerges from lens 18 and impinges on and passes around a small electro-optic crystal 20, the index of refraction of which is varied by subjecting it to a changing ambient electric field. The collimated beam 19 continues on to a focusing lens 22 which is placed at a distance greater than its focal length from electro-optic crystal 20. Lens 22 brings the light to a point focus at a lateral-shearing interferometer 24. Interferometer 24 is preferably of a simple type, such as a Ronchi grating, a holographically formed dual-frequency grating or a misaligned beam-splitter cube. Interferometer 24 causes amplitude division of the laser beam, producing two overlapping beams 26 and 28 that propagate at slightly different angles. At an image plane 30 chosen such that it and the electro-optic crystal 20 are at conjugate foci of focusing lens 22, a dual image of the electro-optic crystal 20 and the surrounding beam are formed, as illustrated in FIG. 2.

Figure 2:
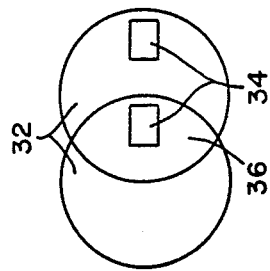
FIG. 2 is a view illustrating overlapping images produced.

Each of the two overlapping images shown in FIG. 2 consist of an illuminated area of uniform phase 32 in which is embedded an image 34 of the electro-optic crystal 20. As can be seen in FIG. 2, one of images 34 of the electro-optic crystal 20 overlaps the uniform-phase field 32 of the other image. Within this area of overlap 36, the portion of the wavefront 34 passing through the electro-optic crystal in one image interferes with the portion of the wavefront 32 passing around the crystal in the other image. Because of their different phases, the resultant combined intensity is the square of the sum of the electric vectors of the two wavefronts. This intensity may vary between zero and approximately twice the intensity of either beam, and is a function of the magnitude of the ambient electric field which modified the index of refraction of electro-optic crystal 20.

The intensity at the image overlap is sampled by an optical fiber bundle 38 for an array of points and is fed to a remote high speed detector 40. The signal from detector 40 is recorded by an oscilloscope, streak camera, or other ultra high-speed recording device 42. This signal corresponds directly to the magnitude of the ambient electric field which is being measured.

As will be appreciated, this invention is particularly adapted for measuring large electric fields. However, its sensitivity is similar to that of other single path interferometers.

I claim:

1. A lateral-shearing electro-optic field sensor comprising a coherent light source, means for diffracting said light into a spacially coherent beam, a collimating lens mounted for receiving said spacially coherent beam and converting said beam to an emerging collimating beam, an electro-optic crystal mounted in a minor portion of said collimated beam, a focusing lens mounted at a distance greater than its focal length from said electro-optic crystal, said focusing lens focusing said collimated beam to a point focus, a lateral-shearing interferometer mounted at said focus point and producing an amplitude division of the focused light at said focus point to produce two overlapping beams that propagate at slightly different angles, and presenting said two overlapping beams on an image plane that is positioned such that it and said electro-optic crystal are at conjugate foci of said focusing lens.

2. A lateral-shearing electro-optic field sensor as set forth in claim 1, wherein said coherent light source is a laser light source that is transmitted by fiber optic to said diffraction means.

3. A lateral-shearing electro-optic field sensor as set forth in claim 1, wherein said image plane has a fiber optic bundle sampling array connected for sampling an array of points, a detector connected to said bundle for receiving and detecting said samples, and recording means connected to an output of said detector for recording the information detected by said detector.

* * * * *